United States Patent
Nakagawa et al.

(10) Patent No.: US 11,549,583 B2
(45) Date of Patent: Jan. 10, 2023

(54) CURRENT CONTROL DEVICE

(71) Applicant: DENSO CORPORATION, Kariya (JP)

(72) Inventors: Masashi Nakagawa, Kariya (JP); Fuminori Suzuki, Kariya (JP); Kengo Takei, Kariya (JP)

(73) Assignee: DENSO CORPORATION, Kariya (JP)

( * ) Notice: Subject to any disclaimer, the term of this patent is extended or adjusted under 35 U.S.C. 154(b) by 355 days.

(21) Appl. No.: 16/812,616

(22) Filed: Mar. 9, 2020

(65) Prior Publication Data

US 2020/0208739 A1 Jul. 2, 2020

Related U.S. Application Data

(63) Continuation of application No. PCT/JP2018/034378, filed on Sep. 18, 2018.

(30) Foreign Application Priority Data

Sep. 25, 2017 (JP) .............................. JP2017-183324

(51) Int. Cl.
| | | |
|---|---|---|
| *H01H 9/00* | (2006.01) | |
| *H01H 47/00* | (2006.01) | |
| *H01H 51/22* | (2006.01) | |
| *H01H 51/30* | (2006.01) | |
| *F16H 61/02* | (2006.01) | |
| *G01R 19/00* | (2006.01) | |
| *H02H 3/08* | (2006.01) | |
| *H02H 3/26* | (2006.01) | |
| *H02H 7/22* | (2006.01) | |

(52) U.S. Cl.
CPC ..... *F16H 61/0251* (2013.01); *G01R 19/0007* (2013.01); *H02H 3/08* (2013.01); *H02H 3/26* (2013.01); *H02H 7/22* (2013.01); *F16H 2061/026* (2013.01); *F16H 2061/0255* (2013.01)

(58) Field of Classification Search
CPC ....................... F16H 61/0251; F16H 2061/026
USPC ....................................................... 361/160
See application file for complete search history.

(56) References Cited

U.S. PATENT DOCUMENTS

| | | | |
|---|---|---|---|
| 6,493,204 B1 * | 12/2002 | Glidden | ................ B60T 8/366 361/187 |
| 6,934,140 B1 | 8/2005 | Rober et al. | |
| 9,543,097 B2 | 1/2017 | Suzuki et al. | |

* cited by examiner

*Primary Examiner* — Jared Fureman
*Assistant Examiner* — Lucy M Thomas
(74) *Attorney, Agent, or Firm* — Nixon & Vanderhye P.C.

(57) ABSTRACT

A current control device brings, after a target current has been changed to an upper side, a solenoid into a full-on state at a first timing that arrives in a predetermined control transition cycle shorter than an on-off cycle, determines whether an excitation current has become equal to or larger than a full-on threshold larger than the target current, brings the solenoid into a full-off state at a first timing that arrives in a predetermined energization switching cycle shorter than the on-off cycle after the excitation current has become equal to or larger than the full-on threshold, determines whether the excitation current has become equal to or smaller than a full-off threshold smaller than the target current, and causes a transition to a steady control at a first timing that arrives in the control transition cycle after the excitation current has become equal to or smaller than the full-off threshold.

7 Claims, 10 Drawing Sheets

CURRENT CONTROL DEVICE

CROSS REFERENCE TO RELATED APPLICATIONS

The present application is a continuation application of International Patent Application No. PCT/JP2018/034378 filed on Sep. 18, 2018, which designated the U.S. and claims the benefit of priority from Japanese Patent Application No. 2017-183324 filed on Sep. 25, 2017. The entire disclosures of all of the above applications are incorporated herein by reference.

TECHNICAL FIELD

The present disclosure relates to a current control device.

BACKGROUND

Conventionally, there has been known a technique for controlling a current of a solenoid of a solenoid valve.

SUMMARY

A current control device according to an aspect of the present disclosure brings, after a target current has been changed to an upper side, a solenoid into a full-on state at a first timing that arrives in a predetermined control transition cycle shorter than an on-off cycle, determines whether an excitation current has become equal to or larger than a full-on threshold larger than the target current, brings the solenoid into a full-off state at a first timing that arrives in a predetermined energization switching cycle shorter than the on-off cycle after the excitation current has become equal to or larger than the full-on threshold, determines whether the excitation current has become equal to or smaller than a full-off threshold smaller than the target current, and causes a transition to a steady control at a first timing that arrives in the control transition cycle after the excitation current has become equal to or smaller than the full-off threshold.

A current control device according to another aspect of the present disclosure brings, after a target current has been changed to a lower side, a solenoid into a full-off state at a first timing that arrives in a predetermined control transition cycle shorter than an on-off cycle, determines whether an excitation current has become equal to or smaller than a full-off threshold smaller than the target current, and causes a transition to the steady control at a first timing that arrives in the control transition cycle after the excitation current has become equal to or smaller than the full-off threshold.

BRIEF DESCRIPTION OF DRAWINGS

Objects, features and advantages of the present disclosure will become apparent from the following detailed description made with reference to the accompanying drawings. In the drawings.

DETAILED DESCRIPTION

A certain current control device has a plurality of control modes including a steady mode and a transition mode. The steady mode is executed when a target current is kept constant. In the steady mode, on and off operation of the current (that is, energization and deenergization) is repeated in a predetermined PWM cycle so that an average value of an excitation current matches a target current.

The transition mode is executed when the target current is changed. In the transition mode, the current is fully turned on to the target current, and when the current has reached the target current, the current is repeatedly turned on and off in a cycle shorter than the PWM cycle of the steady mode, and preparation is made for resynchronization with the PWM cycle of the steady mode. When the timing coincides with the PWM cycle of the steady mode, the transition to the steady mode is executed. It is conceivable to apply the above-described current control device to a solenoid valve. However, after the current has been fully turned on in the transition mode, the current is turned off at the target current. For that reason, when the above-described current control device is applied to the solenoid valve, a valve body cannot reach a desired overstroke state (that is, an appropriate position for realizing a high response), resulting in a concern that a variation delay of the control amount occurs.

Further, the above-described current control device has a standby period in which a current is repeatedly turned on and off at a relatively fast frequency until the timing coincides with the PWM cycle of the steady mode when the transition is made from the transition mode to the steady mode. For that reason, when the above-described current control device is applied to the solenoid valve, since the amplitude of the current during the standby period is very small, the valve body cannot follow the current amplitude, and a dynamic friction state of the valve body is not maintained. This leads to an operation delay of the valve body, and there is a concern that an overshoot of the control amount becomes large.

Each of current control devices according to first and second aspects of the present disclosure includes a current acquisition unit, a steady control unit, and a target determination unit. The current acquisition unit acquires an excitation current of a solenoid. The steady control unit executes a steady control in which an operation of deenergizing the solenoid after energizing the solenoid is repeated in a predetermined on-off cycle to keep an average value of the excitation current in a vicinity of a target current. The target determination unit determines whether the target current has been changed at every predetermined target determination cycle shorter than the on-off cycle when the steady control is executed.

The current control devices according to the first aspect further includes a full-on control unit, a full-on determination unit, a full-off control unit, a full-off determination unit, and a control transition unit. The full-on control unit brings the solenoid into a full-on state in which the solenoid is constantly energized at a first timing that arrives in a predetermined control transition cycle shorter than the on-off cycle after the target current has been changed to an upper side.

The full-on determination unit determines whether the excitation current has become equal to or larger than a full-on threshold larger than the target current when the solenoid is in the full-on state. The full-off control unit brings the solenoid into a full-off state in which the solenoid is constantly deenergized at a first timing that arrives in a predetermined energization switching cycle shorter than the on-off cycle after the excitation current has become equal to or larger than the full-on threshold.

The full-off determination unit determines whether the excitation current has become equal to or smaller than a full-off threshold smaller than the target current when the solenoid is in the full-off state. The control transition unit causes a transition to the steady control at a first timing that arrives in the control transition cycle after the excitation current has become equal to or smaller than the full-off threshold.

The current control device according to the second aspect further includes a full-off control unit, a full-off determination unit, and a control transition unit. The full-off control unit brings the solenoid into a full-off state in which the solenoid is constantly deenergized at a first timing that arrives in a predetermined control transition cycle shorter than the on-off cycle after the target current has been changed to a lower side.

The full-off determination unit determines whether the excitation current has become equal to or smaller than a full-off threshold smaller than the target current when the solenoid is in the full-off state. The control transition unit causes a transition to the steady control at a first timing that arrives in the control transition cycle after the excitation current has become equal to or smaller than the full-off threshold.

Accordingly, the current control device according to the first aspect can obtain the following effects (A) to (D) and (F), and the current control device according to the second aspect can obtain the following effects (A) to (C) and (E) to (F).

(A) After the target current has been changed, the full-on state or the full-off state is set without waiting for a timing at which the on-off cycle is completed, so that the transition from the steady control to the transition control can be quickly executed.

(B) After transitioning to the transition control, the excitation current is changed to a certain threshold (that is, the full-on threshold or the full-off threshold) beyond the target current so that the valve body can reach a desired overstroke state. For that reason, the variation delay of the control amount (that is, a rise delay or a fall delay) is restricted, thereby being capable of enhancing the responsiveness.

(C) Since the energization is stopped at a relatively early timing when the excitation current becomes equal to or larger than the full-on threshold or lower than the full-off threshold, the valve body can be stopped quickly in a desired overstroke state. For that reason, the overshoot of the control amount can be suitably controlled.

(D) Since the excitation current is changed to the full-off threshold relatively quickly after the excitation current has reached the full-on threshold, the valve body can be quickly returned from the overstroke state to the steady position. Further, since the excitation current is changed relatively largely so as to go across the full-on threshold value and the full-off threshold value, the dynamic friction state of the valve body is maintained. This makes it possible to restrict the occurrence of the overshoot of the control amount caused by the operation delay of the valve body.

(E) The dynamic friction state of the valve body is maintained because the excitation current is changed relatively largely so as to go across the full-off threshold. This makes it possible to restrict the occurrence of the overshoot of the control amount caused by the operation delay of the valve body.

(F) When the excitation current becomes equal to or smaller than the full-off threshold, the control is transitioned to the steady control at a relatively early timing regardless of the timing of the on-off cycle, so that the transition can be executed quickly from the transition control to the steady control.

In the present specification, the "overshoot" is an overshoot of the control amount. In other words, when the control amount is changed toward the target, the control amount is changed so as to exceed the target. When the target is larger than the present control amount, the "overshoot" means that the control amount becomes larger than the target. When the target is smaller than the present control amount, he "overshoot" means that the control amount becomes smaller than the target.

Hereinafter, multiple embodiments will be described with reference to the drawings. The same reference numerals are assigned to substantially the same components in the embodiments, and a description of the same components will be omitted.

First Embodiment

Figure 1:
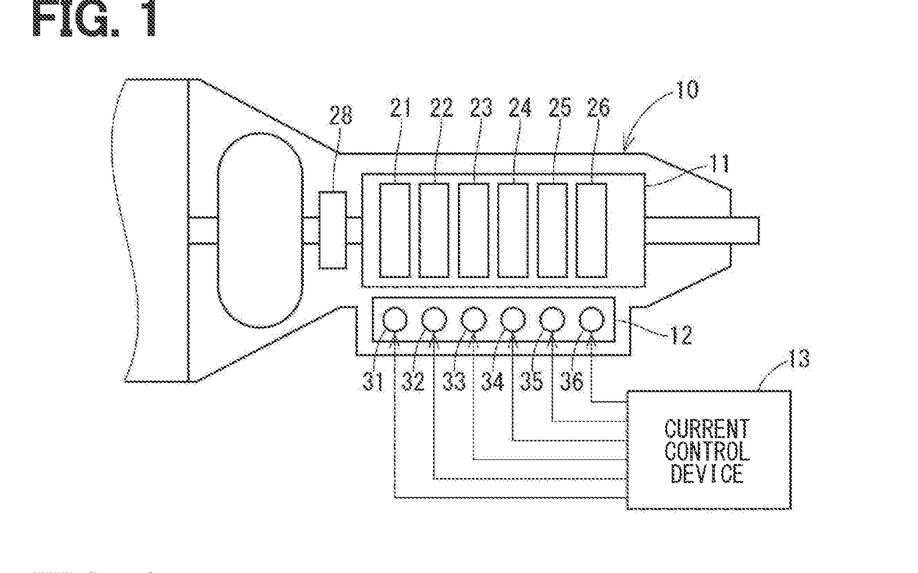
FIG. 1 is a schematic diagram showing an automatic transmission to which a current control device according to a first embodiment is applied.

A current control device according to a first embodiment is applied to an automatic transmission shown in FIG. 1. An automatic transmission 10 includes a transmission mechanism 11, a hydraulic circuit 12, and a current control device 13.

The transmission mechanism 11 has multiple friction elements 21 to 26 configured by, for example, a clutch, a brake, and the like, and a transmission ratio is changed stepwise by selectively engaging the friction elements 21 to 26. The hydraulic circuit 12 has multiple linear solenoid valves 31 to 36 for adjusting a pressure of a hydraulic oil pumped from an oil pump 28 and supplying the hydraulic oil to the friction elements 21 to 26.

Figure 2:
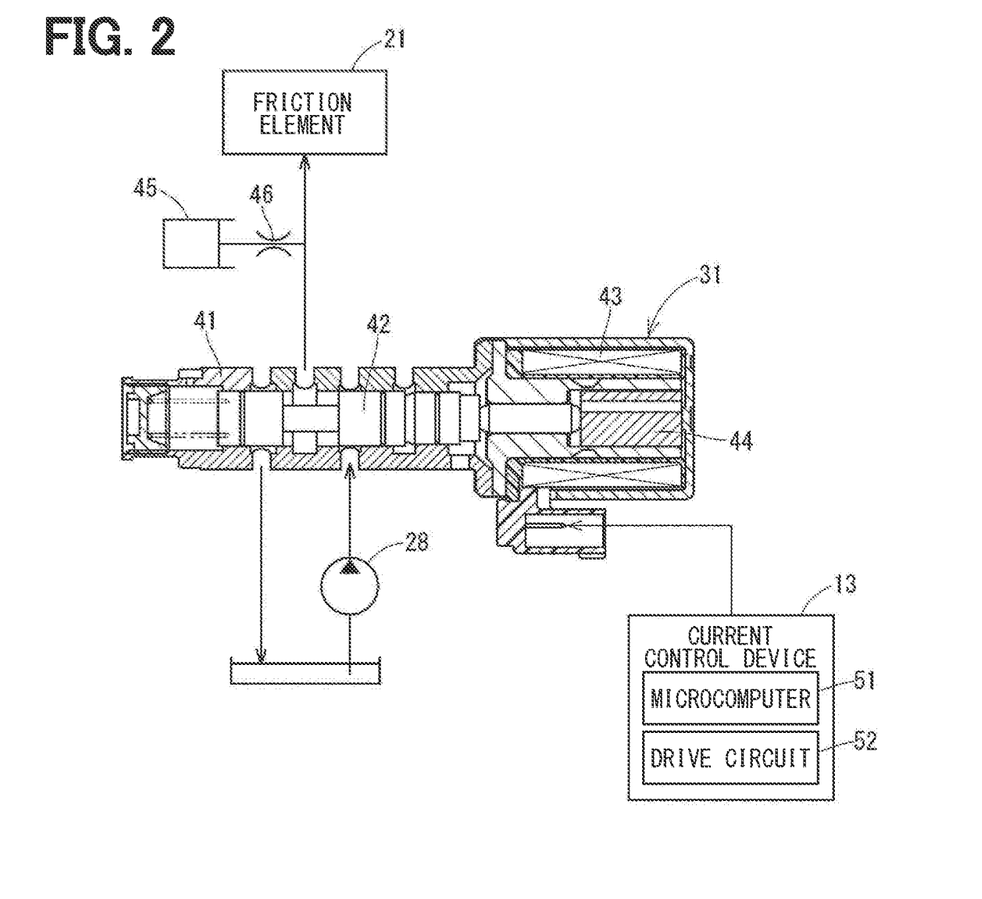
FIG. 2 is a schematic diagram showing a hydraulic circuit of FIG. 1.

As shown in FIG. 2, the linear solenoid valve 31 includes a sleeve 41, a spool 42 as a valve body, and a solenoid 43 for driving the spool 42. A plunger 44 inside the solenoid 43 moves in an axial direction in accordance with a magnitude of an excitation current of the solenoid 43. The spool 42 moves in the axial direction together with the plunger 44, and changes the output hydraulic pressure in accordance with the axial position. A damper 45 and a throttle valve 46 are configured to reduce pulsation of the hydraulic pressure.

The current control device 13 includes a microcomputer 51, a drive circuit 52, and the like. The microcomputer 51 executes program processing based on the detection values of the various sensors to calculate a target value of the output hydraulic pressure of the linear solenoid valves 31 to 36 and a target current of the solenoid 43 corresponding to the target value, and outputs a drive signal corresponding to the target current. The drive circuit 52 energizes or deenergizes the solenoid 43 in accordance with the drive signal. The current control device 13 controls the excitation current of the solenoid 43.

<Current Control>

Figure 3:
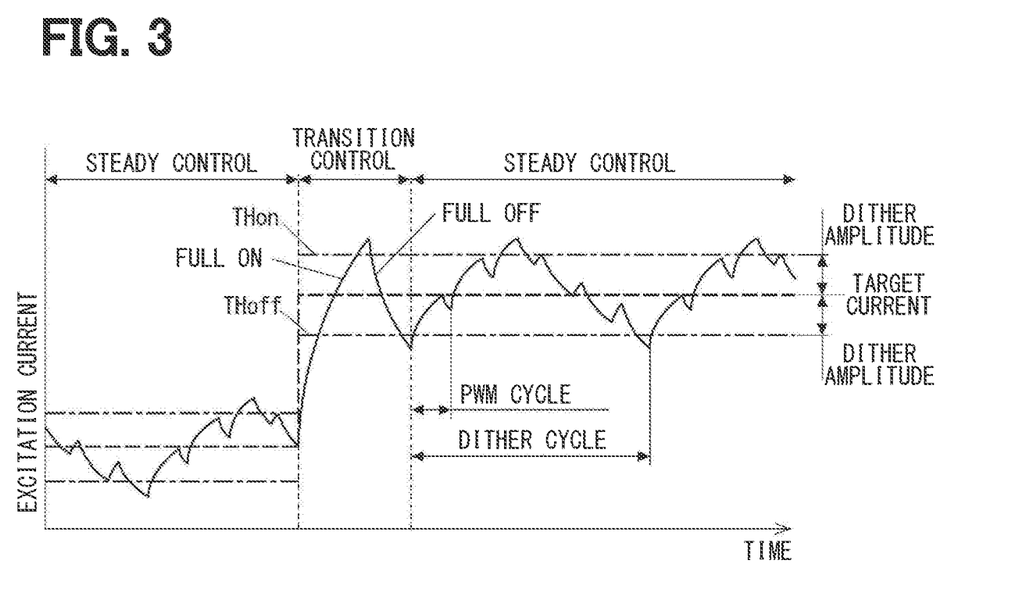
FIG. 3 is a first timing diagram illustrating a current control executed by the current control device of FIG. 1.
Figure 4:
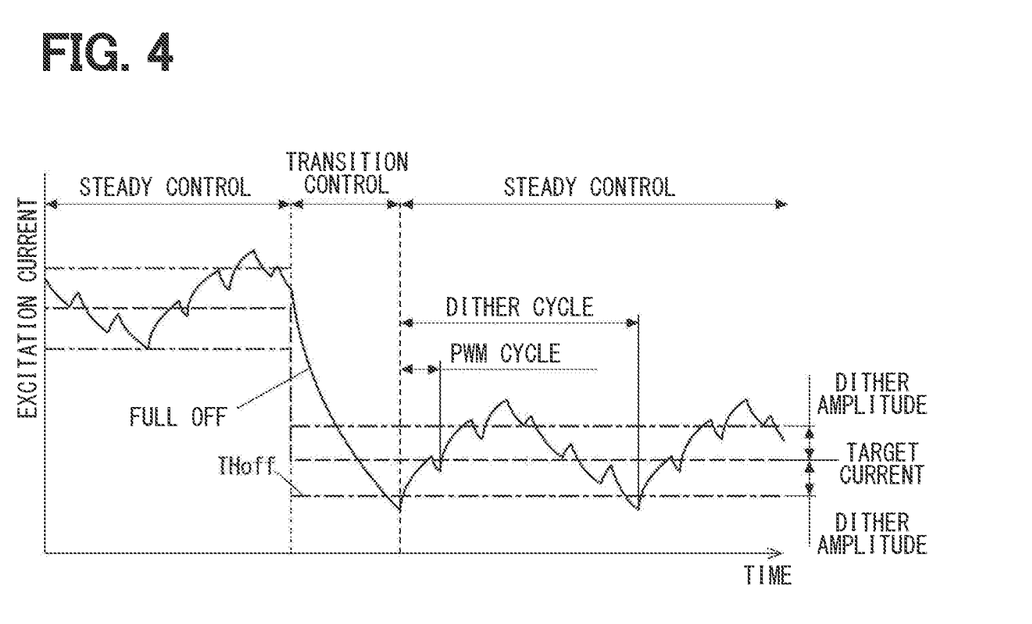
FIG. 4 is a second timing diagram illustrating the current control executed by the current control device of FIG. 1.

Next, a current control executed by the current control device 13 will be described with reference to FIGS. 3 and 4. The current control executed by the current control device 13 includes a steady control and a transition control. The steady control is a control executed when the target current is kept constant, and repeating the operation of deenergizing the solenoid 43 after energizing the solenoid 43 in a PWM cycle to keep an average value of the excitation current of the solenoid 43 in the vicinity of the target current. In the present embodiment, the average value of the excitation current is periodically changed between the "target current+ dither amplitude" and the "target current−dither amplitude" in a dither cycle longer than the PWM cycle. The excitation current is periodically changed in a dither cycle, as a result of which the spool 42 is slightly vibrated, and the dynamic friction state of the spool 42 is maintained.

The transition control is a control executed when the target current is changed, and changes the excitation current as quickly as possible to the vicinity of the changed target current. As shown in FIG. 3, if the target current has been changed to an upper side, the solenoid 43 is brought into a full-on state and then brought into a full-off state. The full-on state means that the solenoid 43 is constantly energized. The full-off state means that the solenoid 43 is constantly deenergized. The full-on state is maintained until the excitation current becomes equal to or more than a full-on threshold. The full-off state is maintained until the excitation current becomes equal to or less than a full-off threshold. As shown in FIG. 4, when the target current has been changed to a lower side, the solenoid 43 is brought into the full-off state. After the transition control, the current control is shifted to the steady control.

<Function Units of Current Control Device>

Next, functional units of the current control device 13 will be described with reference to FIGS. 5 to 8. The current control device 13 includes a setting unit 55, a dithering unit 56, a current acquisition unit 57, a current comparison unit 58, a steady control unit 59, and a transition control unit 61.

Figure 5:
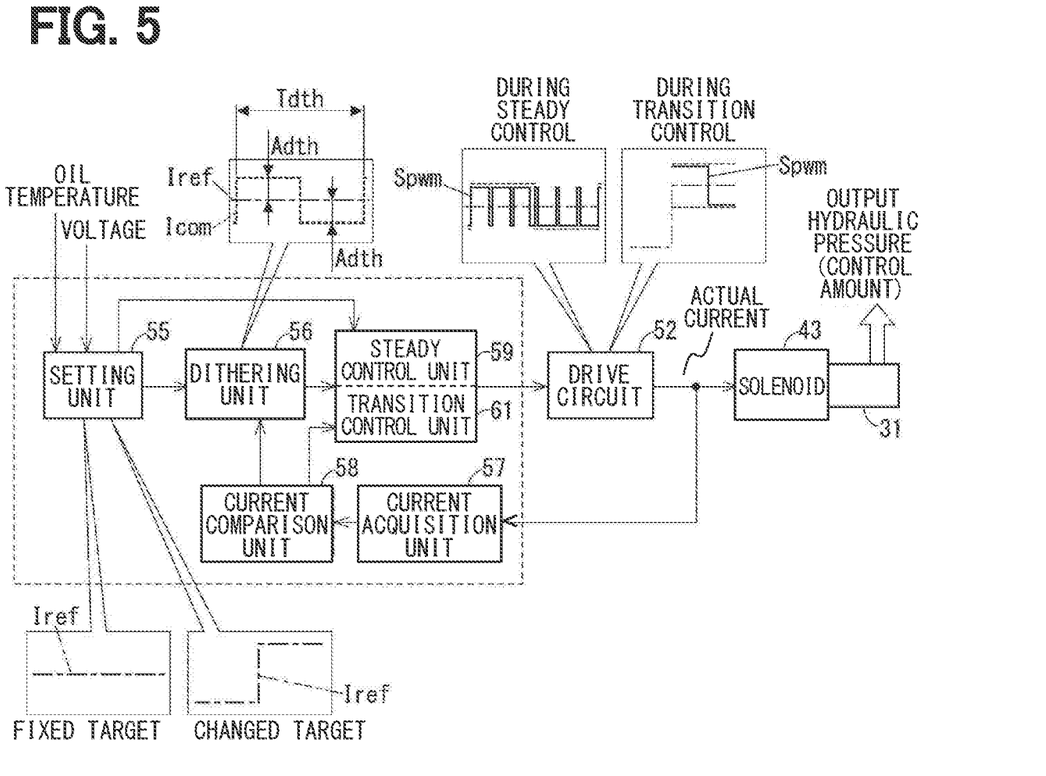
FIG. 5 is a block diagram illustrating functional units of the current control device of FIG. 1.

The setting unit 55 sets a PWM cycle Tpwm (or a PWM frequency), a dither cycle Tdth (or a dither frequency), a dither amplitude Adth, a target current Iref, a full-on threshold THon, and a full-off threshold THoff. For example, the dither amplitude Adth is set in accordance with an oil temperature of the hydraulic circuit 12 and a voltage of the current control device 13. The full-on threshold THon is set to "target current Iref+dither amplitude Adth". The full-off threshold THoff is set to "target current Iref−dither amplitude Adth".

In order to periodically change the excitation current in the dither cycle Tdth during the steady control, the dithering unit 56 periodically changes a command current Icom from which a drive signal Spwm (that is, a PWM signal) is generated between the "target current Iref+dither amplitude Adth" and the "target current Iref−dither amplitude Adth".

The current acquisition unit 57 acquires the excitation current at every current acquisition timing that arrives in a current acquisition cycle Tad which is shorter than the PWM cycle Tpwm. In the present embodiment, for example, the current acquisition cycle Tad is about ¼ of the PWM cycle Tpwm. The current comparison unit 58 compares an average value of the excitation current for a predetermined period with the command current Icom. The above comparison is executed at an F/B calculation timing shown in FIGS. 7 and 8. Based on the command current Icom, the steady control unit 59 generates and outputs a drive signal Spwm so that a difference between the average value of the excitation current and the command current Icom becomes small, and executes the steady control.

Figure 6:
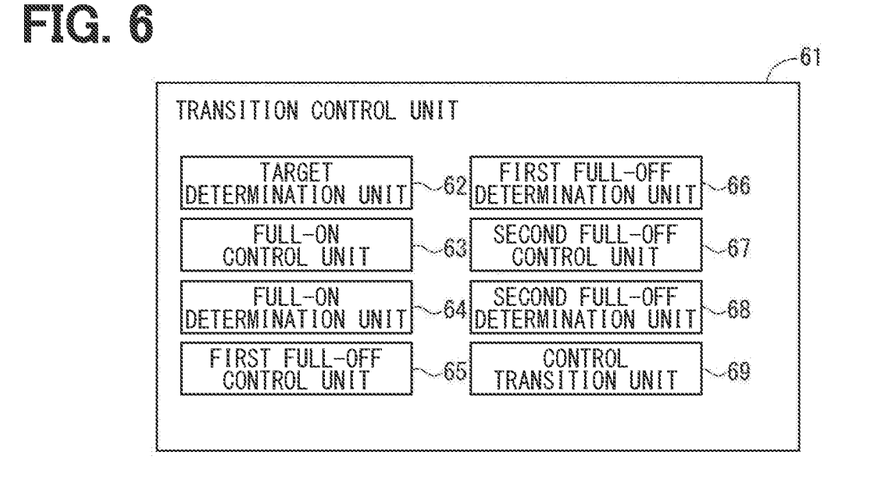
FIG. 6 is a block diagram illustrating a transition control unit of FIG. 5.
Figure 7:
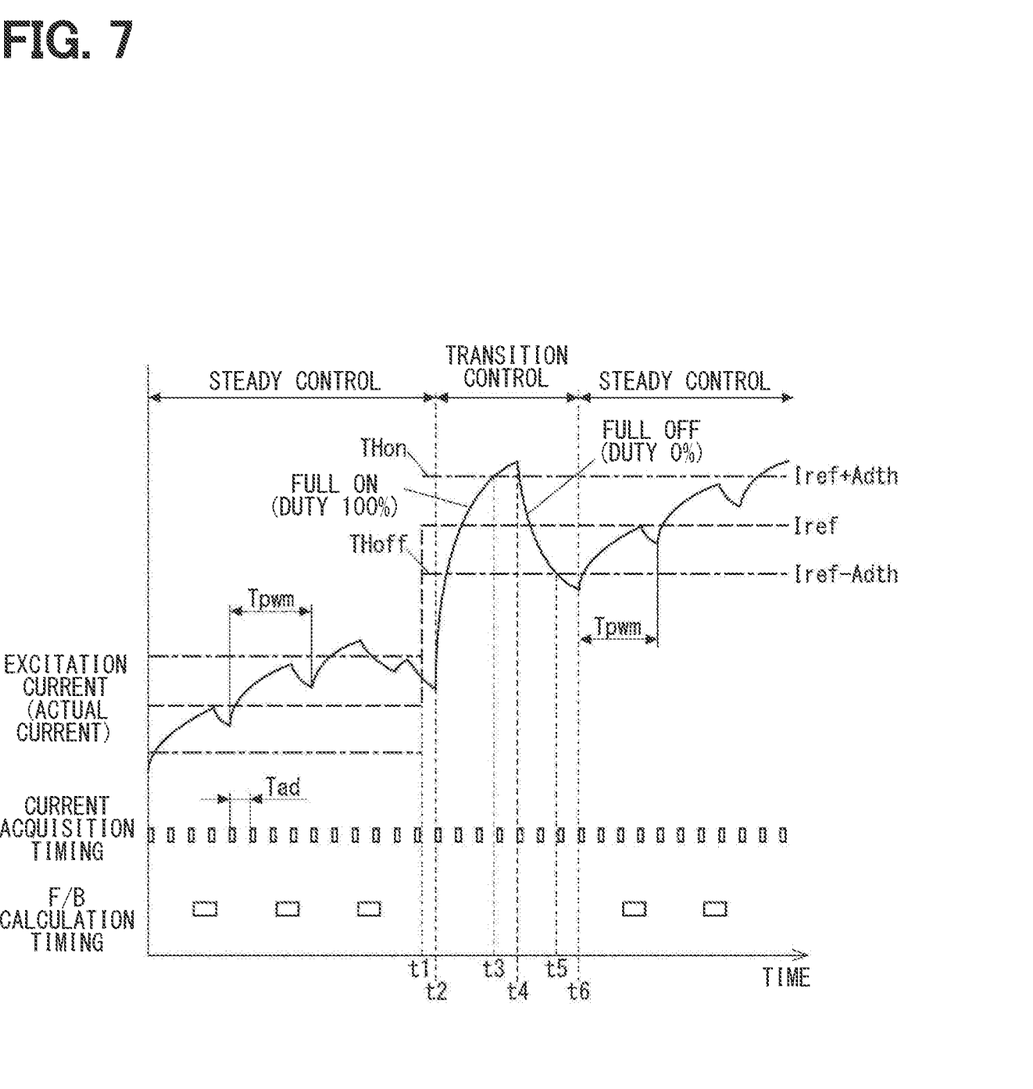
FIG. 7 is a first timing diagram showing an excitation current of a solenoid when the current control device of FIG. 1 executes a transition control.
Figure 8:
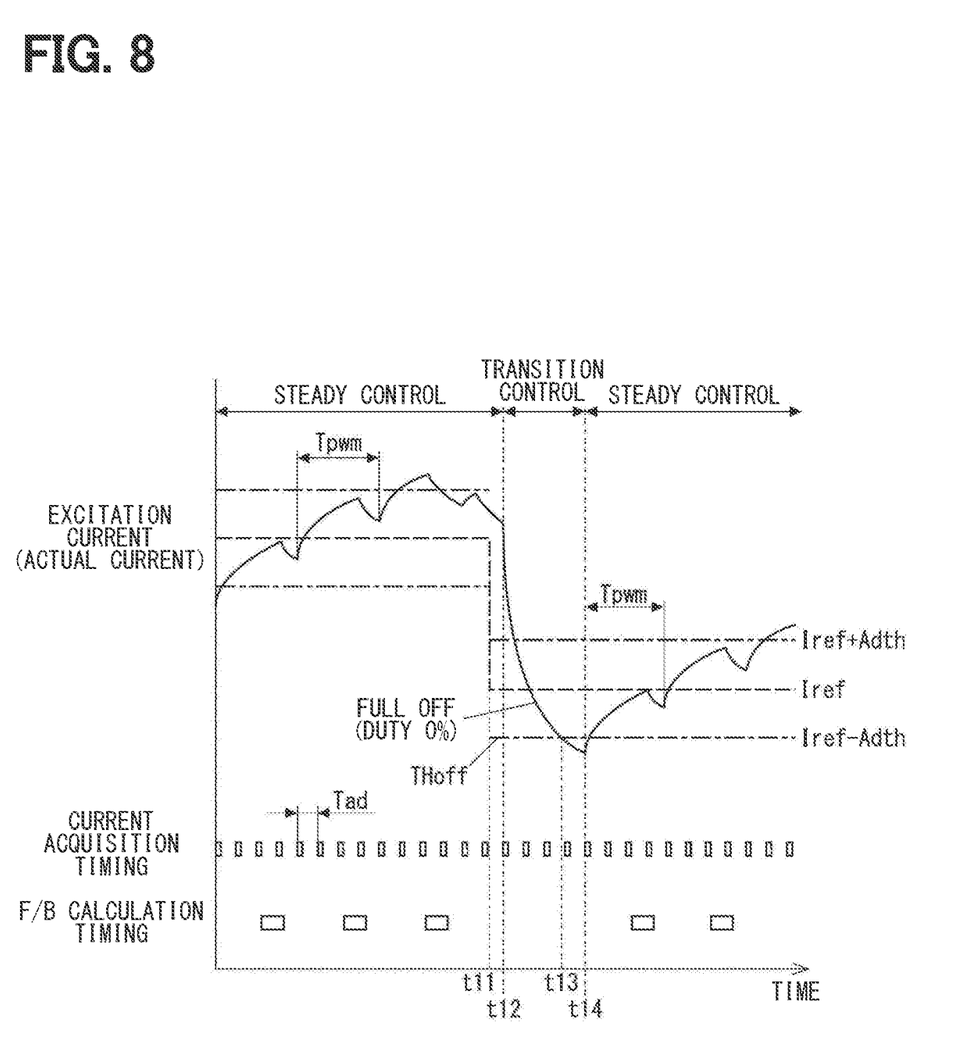
FIG. 8 is a second timing diagram showing the excitation current of the solenoid when the current control device of FIG. 1 executes the transition control.

The transition control unit 61 executes a transition control. The transition control unit 61 includes a target determination unit 62, a full-on control unit 63, a full-on determination unit 64, a first full-off control unit 65, a first full-off determination unit 66, a second full-off control unit 67, a second full-off determination unit 68, and a control transition unit 69. The target determination unit 62 determines whether the target current Iref has been changed in every predetermined target determination cycle shorter than the PWM cycle Tpwm when the steady control is executed. The target determination cycle is shorter than the current acquisition cycle Tad. In FIG. 7, the target current Iref is changed at a time t1, and the target determination unit 62 determines the target change between the time t1 and a time t2. In FIG. 8, the target current Iref is changed at a time t11, and the target determination unit 62 determines the target change between the time t11 and a time t12.

The full-on control unit 63 brings the solenoid 43 into the full-on state at a first timing that arrives in a predetermined control transition cycle shorter than the PWM cycle Tpwm after the target current Iref has been changed to the upper side. The full-on state has a duty ratio of 100%. In the present embodiment, the control transition cycle is the same as the current acquisition cycle Tad. In FIG. 7, the full-on state is started at the time t2.

The full-on determination unit 64 determines whether the excitation current has become equal to or larger than the full-on threshold THon larger than the target current Iref when the solenoid 43 is set in the full-on state by the full-on control unit 63. In FIG. 7, the excitation current becomes equal to or larger than the full-on threshold THon at a time t3, and the full-on determination unit 64 determines that the excitation current has become equal to or larger than the full-on threshold THon between the time t3 and a time t4.

The first full-off control unit 65 brings the solenoid 43 into the full-off state at a first timing that arrives in a predetermined energization switching cycle shorter than the PWM cycle Tpwm after the excitation current has become equal to or greater than the full-on threshold THon. The full-off state has a duty ratio of 0%. In the present embodiment, the energization switching cycle is the same as the current acquisition cycle Tad. In FIG. 7, the full-off state is started at the time t4.

When the solenoid 43 is brought in the full-off state by the first full-off control unit 65, the first full-off determination unit 66 determines whether the excitation current has become equal to or smaller than the full-off threshold THoff smaller than the target current Iref. In FIG. 7, the excitation current becomes equal to or smaller than the full-off threshold THoff at a time t5, and the first full-off determination unit 66 determines that the excitation current has become equal to or smaller than the full-off threshold THoff between the time t5 and a time t6.

After the target current Iref has been changed to the lower side, the second full-off control unit 67 brings the solenoids 43 into the full-off state at a first timing that arrives in the control transition cycle. In FIG. 8, the full-off state is started at a time t12. The second full-off determination unit 68 determines whether the excitation current has become equal to or smaller than the full-off threshold THoff when the solenoid 43 is brought into the full-off state by the second full-off control unit 67. In FIG. 8, the excitation current becomes equal to or smaller than the full-off threshold THoff at a time t13, and the second full-off determination unit 68 determines that the excitation current has become equal to or smaller than the full-off threshold THoff between the time t13 and a time t14.

The control transition unit 69 causes the control to transition to the steady control at a first timing that arrives in a control transition cycle after the excitation current has become equal to or smaller than the full-off threshold THoff. The transition to the steady control means that the full-off state made by the first full-off control unit 65 or the second full-off control unit 67 is terminated and the execution of the steady control by the steady control unit 59 is permitted. In FIG. 7, the control transitions to the steady control at the time t6, and in FIG. 8, the control transitions to the steady control at the time t14. At that time, the steady control unit 59 executes the steady control in the PWM cycle Tpwm newly reset from the time t6 or the time t14.

Each of the functional units 55 to 59 and 61 to 69 included in the current control device 13 may be realized by hardware processing executed by a dedicated logic circuit, may be realized by software processing by executing a program stored in advance in a memory such as a computer-readable non-transitory tangible recording medium or the like by a CPU, or may be realized by a combination of a hardware processing and a software processing. Which part of the functional units 55 to 59 and 61 to 69 is realized by hardware processing and which part is realized by software processing can be appropriately selected.

<Processes Executed by Current Control Device>

Figure 9:
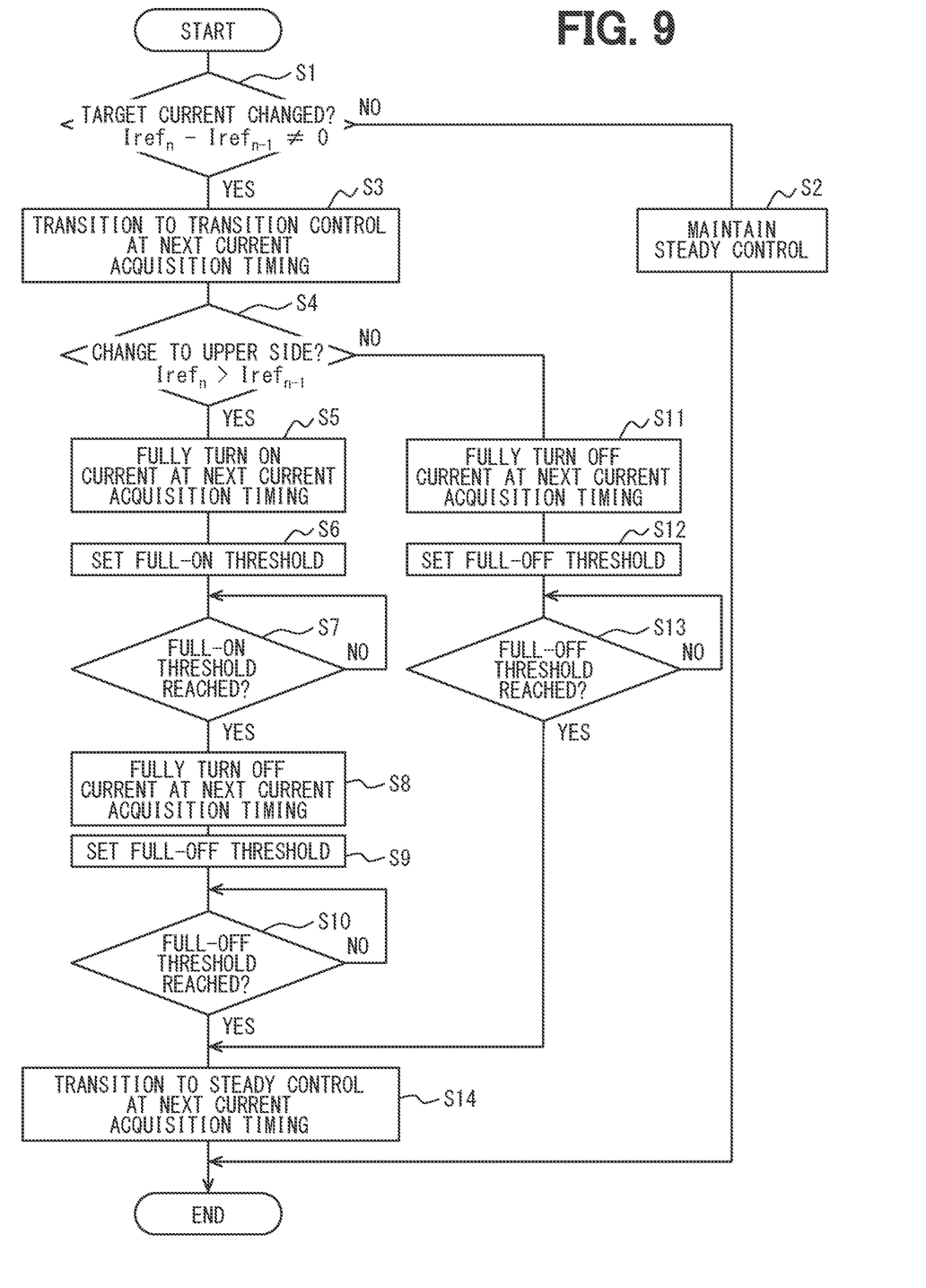
FIG. 9 is a flowchart illustrating the processing executed by the current control device of FIG. 1 for a steady control and a transition control.

Next, processing executed by the current control device 13 for the steady control and the transition control will be described with reference to FIG. 9. A routine shown in FIG. 9 is repeatedly executed in the target determination cycle after the execution of the steady control is started after the current control device 13 is activated. Hereinafter, "S" means a step.

In S1 of FIG. 9, it is determined whether the target current Iref has been changed. When the target current Iref has not been changed and is kept constant (NO in S1), the process proceeds to S2. When the target current Iref has been changed (YES in S1), the process proceeds to S3.

In S2, the steady control is maintained. After S2, the process exits the routine of FIG. 9. In S3, the process proceeds to the transition control at a next current acquisition timing. The transition to the transition control means that the execution of the current control by the full-on control unit 63 or the second full-off control unit 67 is permitted. After S3, the process proceeds to S4.

In S4, it is determined whether the target current Iref has been changed to the upper side. When the change of the target current Iref is the upper side (YES in S4), the process proceeds to S5. When the change of the target current Iref is not the upper side (that is, to the lower side) (NO in S4), the process proceeds to S11.

In S5, the solenoid 43 is brought into the full-on state at the next current acquisition timing. After S5, the process proceeds to S6. In S6, the full-on threshold THon is set. After S6, the process proceeds to S7.

In S7, it is determined whether the excitation current has become equal to or larger than the full-on threshold THon. If the excitation current is equal to or larger than the full-on threshold THon (YES in S7), the process proceeds to S8. If the excitation current is smaller than the full-on threshold THon (NO in S7), the process repeats S7.

In S8, the solenoid 43 is brought into the full-off state at the next current acquisition timing. After S8, the process proceeds to S9. In S9, the full-off threshold THoff is set. After S9, the process proceeds to S10.

In S10, it is determined whether the excitation current has become equal to or smaller than the full-off threshold THoff. When the excitation current has become equal to or smaller than the full-off threshold THoff (YES in S10), the process proceeds to S14. If the excitation current is larger than the full-off threshold THoff (NO in S10), the process repeats S10.

In S11, the solenoid 43 is brought into the full-off state at the next current acquisition timing. After S11, the process proceeds to S12. In S12, the full-off threshold THoff is set. After S12, the process proceeds to S13.

In S13, it is determined whether the excitation current has become equal to or smaller than the full-off threshold THoff. When the excitation current has become equal to or smaller than the full-off threshold THoff (YES in S13), the process proceeds to S14. When the excitation current is larger than the full-off threshold THoff (NO in S13), the process repeats S13.

In S14, the process proceeds to the steady control at the next current acquisition timing. The steady control at that time is started in the newly reset PWM cycle Tpwm. After S14, the process exits the routine of FIG. 9.

<Effects>

As has been described above, in the first embodiment, after the target current Iref has been changed, the full-on state or the full-off state is set without waiting for the completion of the PWM cycle. This makes it possible to quickly transit from the steady control to the transition control.

After the transition to the transition control, the excitation current is changed to a threshold beyond the target current Iref (that is, the full-on threshold THon or the full-off threshold THoff). As a result, the spool 42 can reach a desired overstroke state. For that reason, the variation delay of the output hydraulic pressure can be reduced, and the responsiveness can be enhanced.

When the excitation current has become equal to or larger than the full-on threshold THon or equal to or smaller than the full-off threshold THoff, the energization is stopped at a relatively early time. This makes it possible for the spool 42 to stop quickly in the desired overstroke state. For that reason, the overshoot of the output hydraulic pressure can be suitably controlled.

Further, when the target current Iref has been changed to the upper side, the excitation current is largely changed to the full-off threshold THoff relatively quickly after the excitation current has reached the full-on threshold THon, so that the spool 42 can be quickly returned from the overstroke state to a steady position. In addition, since the excitation current is changed relatively largely so as to go across the full-on threshold THon and the full-off threshold THoff, the dynamic friction state of the spool 42 is maintained. This makes it possible to reduce the occurrence of the overshoot of the output hydraulic pressure caused by the operation delay of the spool 42.

In addition, when the target current Iref has been changed to the lower side, the excitation current is relatively largely changed so as to go across the full-off threshold THoff. As a result, the dynamic friction state of the spool 42 is maintained. This makes it possible to reduce the occurrence of the overshoot of the output hydraulic pressure caused by the operation delay of the spool 42.

When the excitation current has become equal to or smaller than the full-off threshold THoff, the control is shifted to the normal control at a relatively early timing regardless of the timing of the PWM cycle Tpwm. This makes it possible to quickly transit from the transition control to the steady control.

The full-on threshold THon is "target current Iref+dither amplitude Adth", and the full-off threshold THoff is "target current Iref−dither amplitude Adth". For that reason, the full-on threshold THon and the full-off threshold THoff are set in accordance with the dither amplitude Adth. The control transition cycle and the energization switching cycle are the same as the current acquisition cycle. For that reason, the transition of the current control and the switching of the energization are executed without waiting for the timing at which the PWM cycle is completed.

Second Embodiment

Figure 10:
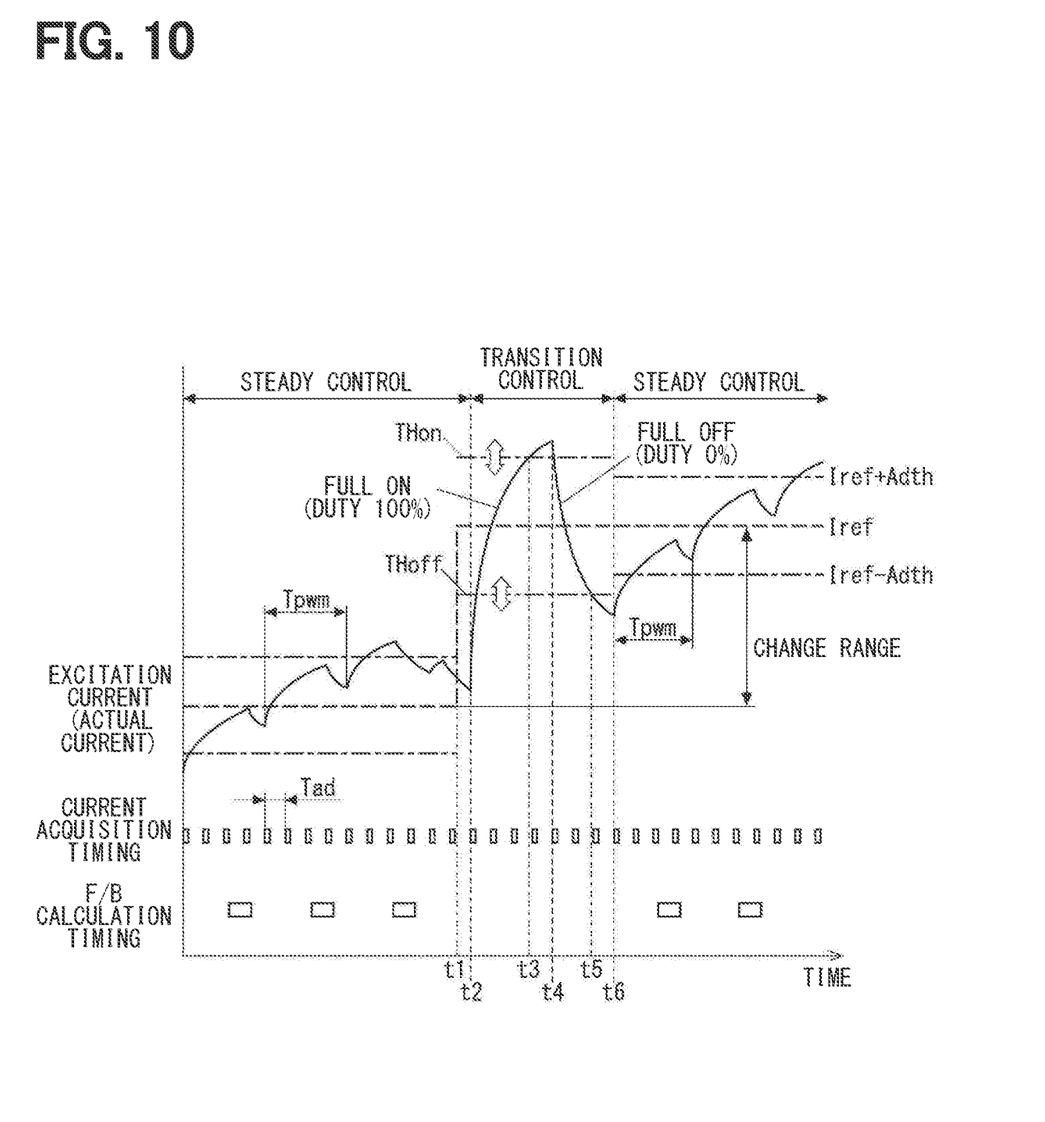
FIG. 10 is a first timing diagram illustrating a current control executed by a current control device according to a second embodiment.
Figure 11:
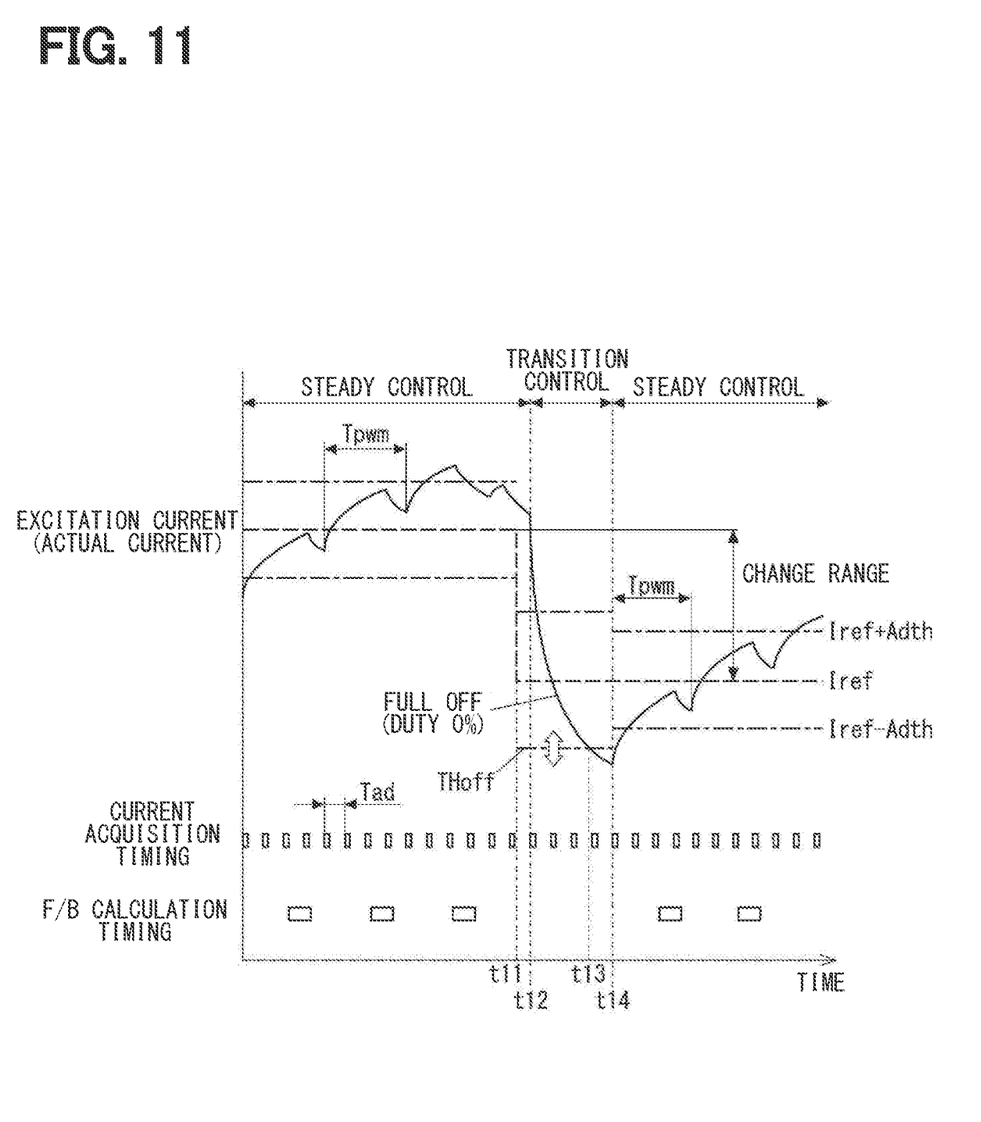
FIG. 11 is a second timing diagram illustrating the current control executed by the current control device according to the second embodiment.

In a second embodiment, as shown in FIGS. 10 and 11, the setting unit 55 sets a full-on threshold THon and a full-off threshold THoff in accordance with a change range of a target current Iref, an oil temperature of a hydraulic circuit 12, and a voltage of a current control device 13. As the change range of the target current Iref, the oil temperature of the hydraulic circuit 12, and the voltage of the current control device 13 are larger, the full-on threshold THon and the full-off threshold THoff are set to be smaller. The full-on threshold THon and the full-off threshold THoff are set in accordance with the specifications of the solenoid 43 and the hydraulic circuit 12 in this manner, thereby being capable of adjusting the hydraulic performance to a desired level.

Third Embodiment

Figure 12:
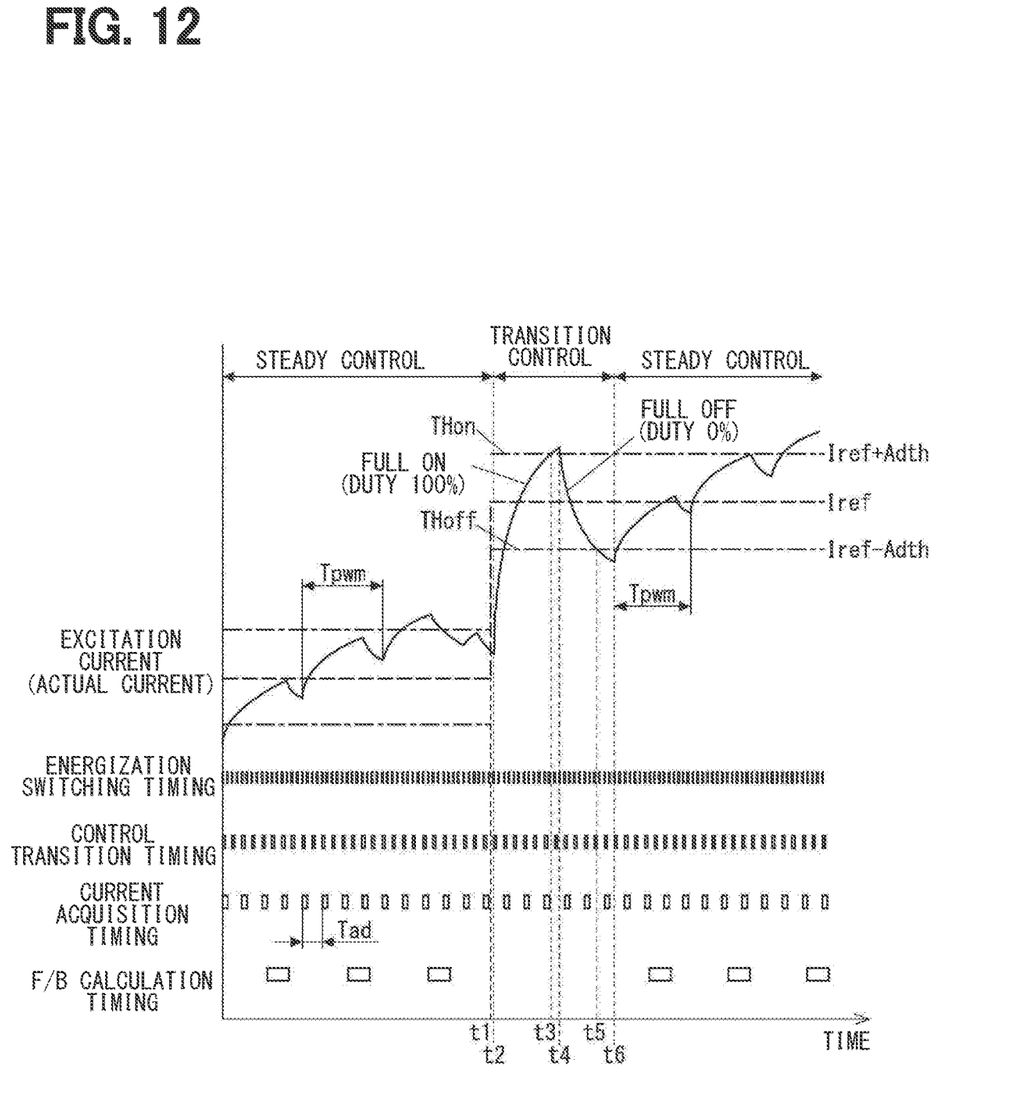
FIG. 12 is a first timing diagram illustrating a current control executed by a current control device according to a third embodiment.

In a third embodiment, as shown in FIG. 12, after the target current Iref has been changed to an upper side, the full-on control unit 63 brings the solenoid 43 into the full-on state at a first timing (control transition timing) that arrives in a control transition cycle shorter than a current acquisition cycle Tad. In addition, the first full-off control unit 65 brings the solenoid 43 into a full-off state at a first timing (energization switching timing) that arrives in an energization switching cycle shorter than the current acquisition cycle Tad after the excitation current has become equal to or larger than a full-on threshold THon.

Figure 13:
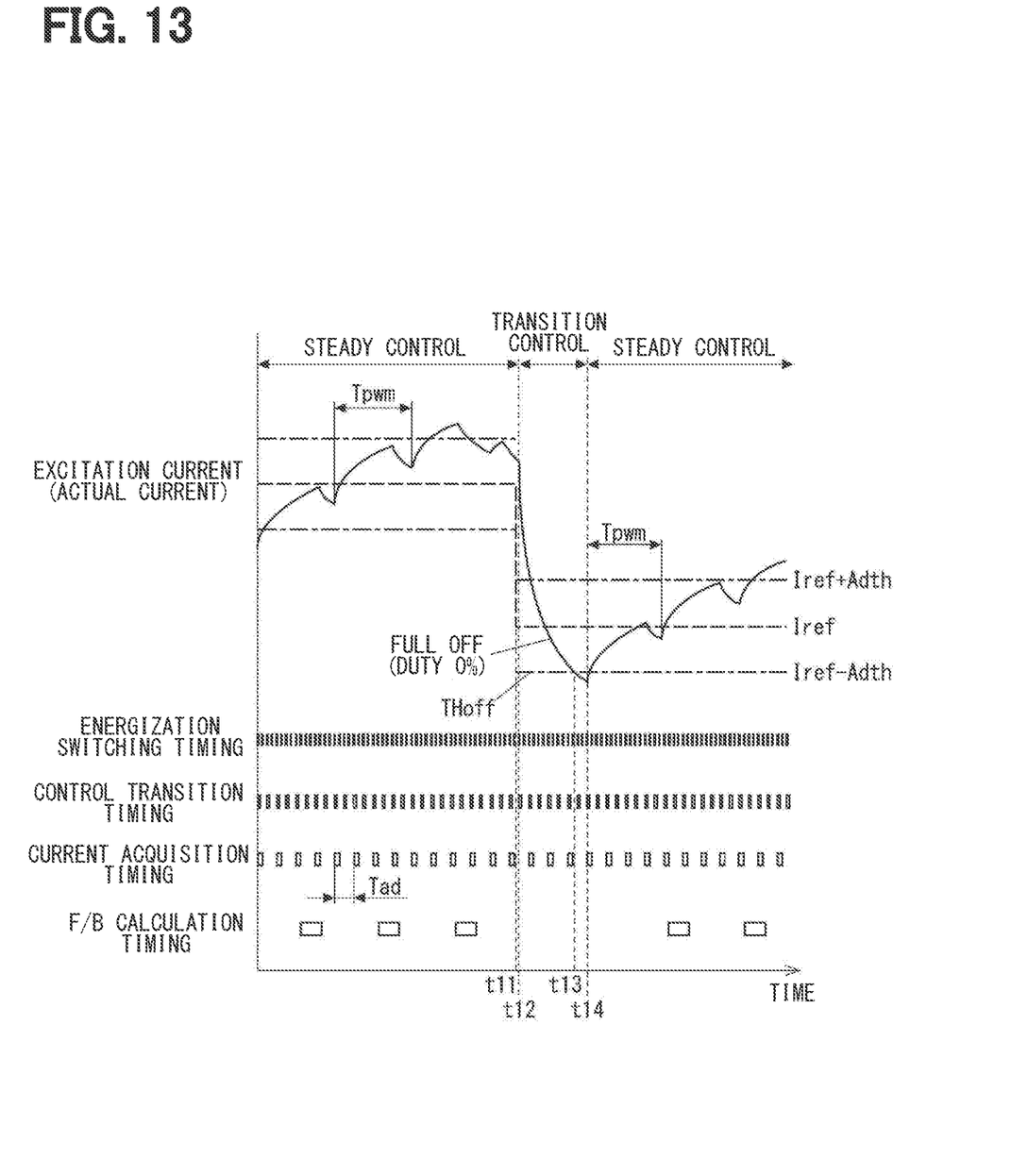
FIG. 13 is a second timing diagram illustrating the current control executed by the current control device according to the third embodiment.

Further, as shown in FIG. 13, the second full-off control unit 67 brings the solenoid 43 into the full-off state at a first timing (control transition timing) that arrives in a control transition cycle shorter than the current acquisition cycle Tad after the target current Iref has been changed to the lower side. Further, as shown in FIGS. 12 and 13, after the excitation current has become equal to or smaller than the full-off threshold THoff, the control transition unit 69 causes the control to transition to the steady control at a first timing (control transition timing) that arrives in the control transition cycle shorter than the current acquisition cycle Tad.

When the control transition cycle and the energization switching cycle are set to be shorter than the current acquisition cycle in this manner, the spool 42 can be more quickly controlled to an optimum state, and the hydraulic performance can be improved.

Other Embodiments

In another embodiment, a normal control unit that executes the same current control as the steady control unit when the target current is changed may be newly provided. The control content at the time of the transition control may be changed in accordance with the change range of the target current. For example, when the change range of the target current is smaller than the predetermined value, the normal control unit may execute the current control, and when the change range of the target current is equal to or larger than the predetermined value, the full-on control unit 63, the full-on determination unit 64, the first full-off control unit 65, the first full-off determination unit 66, the second full-off control unit 67, and the second full-off determination unit 68 may execute the current control.

In another embodiment, the full-on threshold and the full-off threshold may be set according to any one or more of the change range of the target current, an oil temperature of the hydraulic circuit, and a voltage of the current control device. In another embodiment, the current control device is not limited to the linear solenoid valve, but may be applied to other types of solenoid valves. The solenoid valve is not limited to the spool type, and may be another type of valve. Further, the current control device is not limited to the hydraulic pressure control, and may control other control amounts.

The present disclosure has been described on the basis of embodiments. However, the present disclosure is not limited to such embodiments and structures. The present disclosure also encompasses various modifications and variations within the scope of equivalents. Also, various combinations and forms, as well as other combinations and forms that include only one element, more, or less, are within the scope and spirit of the present disclosure.

What is claimed is:

1. A current control device configured to control a current of a solenoid of a solenoid valve, the current control device comprising:
   a current acquisition unit configured to acquire an excitation current of the solenoid;
   a steady control unit configured to execute a steady control in which an operation of deenergizing the solenoid after energizing the solenoid is repeated in a predetermined on-off cycle to keep an average value of the excitation current in a vicinity of a target current;
   a target determination unit configured to determine whether the target current has been changed at every predetermined target determination cycle shorter than the on-off cycle when the steady control is executed;
   a full-on control unit configured to bring the solenoid into a full-on state in which the solenoid is constantly energized at a first timing that arrives in a predetermined control transition cycle shorter than the on-off cycle after the target current has been changed to an upper side;
   a full-on determination unit configured to determine whether the excitation current has become equal to or larger than a full-on threshold larger than the target current when the solenoid is in the full-on state;

a full-off control unit configured to bring the solenoid into a full-off state in which the solenoid is constantly deenergized at a first timing that arrives in a predetermined energization switching cycle shorter than the on-off cycle after the excitation current has become equal to or larger than the full-on threshold;

a full-off determination unit configured to determine whether the excitation current has become equal to or smaller than a full-off threshold smaller than the target current when the solenoid is in the full-off state; and a control transition unit configured to cause a transition to the steady control at a first timing that arrives in the control transition cycle after the excitation current has become equal to or smaller than the full-off threshold.

2. The current control device according to claim 1, wherein the steady control unit is further configured to periodically change the average value of the excitation current between "the target current+a dither amplitude" and "the target current−the dither amplitude" in a dither cycle longer than the on-off cycle, the full-on threshold is "the target current+the dither amplitude", and the full-off threshold is "the target current−the dither amplitude".

3. The current control device according to claim 1, wherein the full-on threshold and the full-off threshold are set according to at least one of a change range of the target current, a temperature of a fluid output from the solenoid valve, and a voltage of the current control device.

4. The current control device according to claim 1, wherein the current acquisition unit is further configured to acquire the excitation current in a current acquisition cycle shorter than the on-off cycle, and one or both of the control transition cycle and the energization switching cycle are same as the current acquisition cycle.

5. The current control device according to claim 1, wherein the current acquisition unit is further configured to acquire the excitation current in the current acquisition cycle shorter than the on-off cycle, and one or both of the control transition cycle and the energization switching cycle are shorter than the current acquisition cycle.

6. The current control device according to claim 1, wherein the solenoid valve is of a spool type.

7. The current control device according to claim 6, wherein the solenoid valve is used for a hydraulic control.

\* \* \* \* \*